US008325556B2

(12) United States Patent
Shepard

(10) Patent No.: US 8,325,556 B2
(45) Date of Patent: Dec. 4, 2012

(54) SEQUENCING DECODER CIRCUIT

(75) Inventor: Daniel R. Shepard, North Hampton, NH (US)

(73) Assignee: Contour Semiconductor, Inc., North Billerica, MA (US)

( * ) Notice: Subject to any disclaimer, the term of this patent is extended or adjusted under 35 U.S.C. 154(b) by 327 days.

(21) Appl. No.: 12/575,055

(22) Filed: Oct. 7, 2009

(65) Prior Publication Data

US 2010/0085830 A1    Apr. 8, 2010

Related U.S. Application Data

(60) Provisional application No. 61/195,449, filed on Oct. 7, 2008.

(51) Int. Cl.
*G11C 8/00* (2006.01)
(52) U.S. Cl. ............... 365/230.06; 365/239; 365/230.03
(58) Field of Classification Search ............. 365/230.06, 365/239, 163, 51, 113, 115, 63, 105, 230.03, 365/230.08, 189.09, 189.05, 185.09, 230.01
See application file for complete search history.

(56) References Cited

U.S. PATENT DOCUMENTS

| | | | |
|---|---|---|---|
| 2,709,042 A | 5/1955 | Couffignal | |
| 3,091,754 A | 5/1963 | Nazare | |
| 3,245,051 A | 4/1966 | Robb | |
| 3,308,433 A | 3/1967 | Lochinger | |
| 3,373,406 A | 3/1968 | Cannon et al. | |
| 3,576,549 A | 4/1971 | Hess et al. | |
| 3,626,389 A | 12/1971 | Waaben | |
| 3,701,119 A | 10/1972 | Waaben et al. | |
| 3,721,964 A | 3/1973 | Barrett et al. | |
| 3,806,896 A | 4/1974 | Mar | |
| 3,838,405 A | 9/1974 | Arnett et al. | |
| 3,942,071 A | 3/1976 | Krebs et al. | |
| 4,010,453 A | 3/1977 | Lewis | |
| 4,070,654 A | 1/1978 | Tachi et al. | |
| 4,090,190 A | 5/1978 | Rostkovsky et al. | |
| 4,240,151 A | 12/1980 | Kawagoe et al. | |
| 4,308,595 A | 12/1981 | Houghton | |
| 4,312,046 A | 1/1982 | Taylor | |
| 4,322,822 A | 3/1982 | McPherson | |
| 4,342,102 A | 7/1982 | Puar | |
| 4,347,585 A | 8/1982 | Eardley | |
| 4,385,368 A | 5/1983 | Principi et al. | |

(Continued)

FOREIGN PATENT DOCUMENTS

DE    10111454 A1    9/2002

(Continued)

OTHER PUBLICATIONS

Berger, "Models for Contacts to Planar Devices," Solid-State Electronics, vol. 15 (1972), pp. 145-158.

(Continued)

*Primary Examiner* — Dang Nguyen
(74) *Attorney, Agent, or Firm* — Bingham McCutchen LLP

(57) ABSTRACT

A memory-array decoder operably coupled to a memory array comprising a sequence of rows and receiving as input a plurality of address bits includes first and second decoder stages. The first decoder stage selects one or more first rows by decoding a first subset of the address bits, and the second decoder stage selects one or more second rows based on locations, within the sequence, of one or more third rows different from the one or more second rows.

14 Claims, 1 Drawing Sheet

U.S. PATENT DOCUMENTS

| | | | |
|---|---|---|---|
| 4,394,752 A | 7/1983 | Boudon et al. | |
| 4,404,480 A | 9/1983 | Ransom et al. | |
| 4,419,741 A | 12/1983 | Stewart et al. | |
| 4,442,507 A | 4/1984 | Roesner | |
| 4,479,200 A | 10/1984 | Sato et al. | |
| 4,525,921 A | 7/1985 | Carson et al. | |
| 4,534,008 A | 8/1985 | Fuchs et al. | |
| 4,554,640 A | 11/1985 | Wong et al. | |
| 4,561,070 A | 12/1985 | Armstrong | |
| 4,608,672 A | 8/1986 | Roberts et al. | |
| 4,646,128 A | 2/1987 | Carson et al. | |
| 4,646,266 A | 2/1987 | Ovshinsky et al. | |
| 4,661,927 A | 4/1987 | Graebel | |
| 4,710,900 A | 12/1987 | Higuchi | |
| 4,721,885 A | 1/1988 | Brodie | |
| 4,757,475 A | 7/1988 | Awaya et al. | |
| 4,772,886 A | 9/1988 | Hasegawa et al. | |
| 4,782,340 A | 11/1988 | Czubatyj et al. | |
| 4,800,529 A | 1/1989 | Ueno et al. | |
| 4,845,679 A | 7/1989 | Vu | |
| 4,884,238 A | 11/1989 | Lee et al. | |
| 4,893,281 A * | 1/1990 | Hashimoto | 365/230.06 |
| 4,920,516 A | 4/1990 | Tsuchimoto et al. | |
| 5,051,865 A | 9/1991 | Kato et al. | |
| 5,163,328 A | 11/1992 | Holland et al. | |
| 5,203,731 A | 4/1993 | Zimmerman | |
| 5,296,716 A | 3/1994 | Ovshinsky et al. | |
| 5,357,471 A | 10/1994 | Alapat | |
| 5,390,145 A | 2/1995 | Nakasha et al. | |
| 5,392,242 A * | 2/1995 | Koike | 365/189.18 |
| 5,397,957 A | 3/1995 | Zimmerman | |
| 5,432,729 A | 7/1995 | Carson et al. | |
| 5,441,907 A | 8/1995 | Sung et al. | |
| 5,463,269 A | 10/1995 | Zimmerman | |
| 5,463,583 A | 10/1995 | Takashina | |
| 5,493,533 A | 2/1996 | Lambrache | |
| 5,569,973 A | 10/1996 | Zimmerman | |
| 5,576,986 A | 11/1996 | Matsuzaki et al. | |
| 5,640,343 A | 6/1997 | Gallagher et al. | |
| 5,668,032 A | 9/1997 | Holmberg et al. | |
| 5,673,218 A | 9/1997 | Shepard | |
| 5,675,531 A | 10/1997 | McClelland et al. | |
| 5,719,589 A | 2/1998 | Norman et al. | |
| 5,835,396 A | 11/1998 | Zhang | |
| 5,837,564 A | 11/1998 | Sandhu et al. | |
| 5,840,608 A | 11/1998 | Chang | |
| 5,889,694 A | 3/1999 | Shepard | |
| 6,055,180 A | 4/2000 | Gudesen et al. | |
| 6,075,723 A | 6/2000 | Naiki et al. | |
| 6,117,720 A | 9/2000 | Harshfield | |
| 6,163,475 A | 12/2000 | Proebsting | |
| 6,185,122 B1 | 2/2001 | Johnson et al. | |
| 6,198,682 B1 | 3/2001 | Proebsting | |
| 6,236,587 B1 | 5/2001 | Gudesen et al. | |
| 6,256,767 B1 | 7/2001 | Kuekes et al. | |
| 6,259,132 B1 | 7/2001 | Pio | |
| 6,288,712 B1 * | 9/2001 | Pinkham et al. | 345/204 |
| 6,351,023 B1 | 2/2002 | Gates et al. | |
| 6,385,075 B1 | 5/2002 | Taussig et al. | |
| 6,459,095 B1 | 10/2002 | Heath et al. | |
| 6,462,998 B1 | 10/2002 | Proebsting | |
| 6,478,231 B1 | 11/2002 | Taussig | |
| 6,552,409 B2 | 4/2003 | Taussig et al. | |
| 6,559,468 B1 | 5/2003 | Kuekes et al. | |
| 6,567,295 B2 | 5/2003 | Taussig et al. | |
| 6,586,327 B2 | 7/2003 | Shepard | |
| 6,587,394 B2 | 7/2003 | Hogan | |
| 6,597,037 B1 | 7/2003 | Forbes et al. | |
| 6,598,164 B1 | 7/2003 | Shepard | |
| 6,613,650 B1 | 9/2003 | Holmberg | |
| 6,721,223 B2 | 4/2004 | Matsumoto et al. | |
| 6,744,681 B2 | 6/2004 | Hogan | |
| 6,839,260 B2 | 1/2005 | Ishii | |
| 6,956,757 B2 | 10/2005 | Shepard | |
| 7,032,083 B1 | 4/2006 | Jensen et al. | |
| 7,054,219 B1 | 5/2006 | Petti et al. | |
| 7,088,613 B2 | 8/2006 | Lue et al. | |
| 7,149,934 B2 | 12/2006 | Shepard | |
| 7,183,206 B2 | 2/2007 | Shepard | |
| 7,190,602 B2 | 3/2007 | Johnson et al. | |
| 7,242,601 B2 | 7/2007 | Dehon et al. | |
| 7,330,369 B2 | 2/2008 | Tran | |
| 7,376,008 B2 | 5/2008 | Shepard | |
| 7,408,798 B2 | 8/2008 | Bernstein et al. | |
| 7,460,384 B2 | 12/2008 | Shepard | |
| 7,471,547 B2 | 12/2008 | Schloesser | |
| 7,548,453 B2 | 6/2009 | Nestler | |
| 7,548,454 B2 | 6/2009 | Nestler | |
| 7,554,873 B2 | 6/2009 | Lee et al. | |
| 7,593,246 B2 | 9/2009 | Shepard | |
| 7,593,256 B2 | 9/2009 | Nestler | |
| 2002/0126526 A1 | 9/2002 | Taussig et al. | |
| 2002/0184459 A1 | 12/2002 | Taussig et al. | |
| 2002/0191434 A1 | 12/2002 | Taussing et al. | |
| 2002/0192895 A1 | 12/2002 | Taussig et al. | |
| 2002/0196659 A1 | 12/2002 | Hurst et al. | |
| 2003/0003633 A1 | 1/2003 | Mei et al. | |
| 2003/0026120 A1 | 2/2003 | Scheuerlein | |
| 2003/0028699 A1 | 2/2003 | Holtzman et al. | |
| 2003/0087495 A1 | 5/2003 | Forbes et al. | |
| 2004/0145938 A1 | 7/2004 | Tihanyi | |
| 2004/0160805 A1 | 8/2004 | Rinerson et al. | |
| 2005/0067675 A1 | 3/2005 | Shepard | |
| 2005/0127350 A1 | 6/2005 | Furkay et al. | |
| 2006/0072427 A1 | 4/2006 | Kanda et al. | |
| 2007/0028150 A1 | 2/2007 | Shepard | |
| 2007/0242494 A1 | 10/2007 | Nestler | |
| 2007/0247890 A1 | 10/2007 | Shepard | |
| 2008/0013354 A1 | 1/2008 | Shepard | |
| 2008/0016414 A1 | 1/2008 | Shepard | |
| 2009/0109726 A1 | 4/2009 | Shepard | |
| 2009/0141535 A1 | 6/2009 | Yang et al. | |
| 2009/0161420 A1 | 6/2009 | Shepard | |
| 2009/0225579 A1 | 9/2009 | Shepard et al. | |
| 2009/0225621 A1 | 9/2009 | Shepard | |
| 2009/0296445 A1 | 12/2009 | Shepard | |

FOREIGN PATENT DOCUMENTS

| | | | |
|---|---|---|---|
| JP | 57-203293 A | | 12/1982 |
| JP | 57-203294 A | | 12/1982 |
| JP | 2-098898 | | 4/1990 |
| WO | WO-9939394 A1 | | 8/1999 |

OTHER PUBLICATIONS

Crawford et al., "An Improved Tunnel Diode Memory System," IBM Journal (Jul. 1963), pp. 199-206.

De Graaf et al., "A Novel High-Density Low-Cost Diode Programmable Read only Memory," IEEE IEDM, session 7.6.1 (1996), pp. 189-192.

Hodges et al., "Analysis and Design of Digital Integrated Circuits," McGraw-Hill Book Company, pp. 27-32.

Hurst, "A Survey of Published Information on Universal Logic Arrays," Microelectronics and Reliability, vol. 16 (1977), pp. 663-674.

International Search Report in International Application No. PCT/US99/02239, mailed May 31, 1999.

International Search Report and Written Opinion in International Patent Application No. PCT/US2007/007792, mailed Oct. 30, 2007 (12 pages).

International Search Report and Written Opinion in International Patent Application No. PCT/US07/011020, mailed Jul. 18, 2008 (14 pages).

International Search Report and Written Opinion in International Patent Application No. PCT/US2008/075986, mailed Jan. 22, 2009 (9 pages).

International Search Report and Written Opinion in International Patent Application No. PCT/US2008/082503, mailed Feb. 25, 2009 (10 pages).

McConnell et al., "Diode-Transistor Logic," Digital Electronics, Chapter 5, West Virginia Univ. (2002), pp. 1-14.

Near et al., "Read-only Memory Adds to Calculator's Repertoire," Electronics (Feb. 3, 1969), pp. 70-77.-

Partial International Search Report in International Patent Application No. PCT/US07/011020, mailed Apr. 14, 2008, 6 pages.

"Summary Page: National Radio Institute 832," Old-Computers.com, ,http://old-computers.com/museum/computer.asp?c=884&st=1., (Apr. 4, 2007) 2 pages.

Wang et al., "High-Current-Density Thin-Film Silcone Diodes Grown at Low Temperature," Applied Phys. Lett., vol. 85(11), pp. 2122-2124 (Sep. 13, 2004).

Wang et al., "Low Temperature Thin-Film Silicon Diodes for Consumer Electronics," Mater. Res. Soc. Symp. Proc., vol. 862 (2005), pp. A15.5.1-A15.5.6.

International Search Report and Written Opinion for PCT/US2009/045931, dated Jan. 21, 2010, 15 pages.

\* cited by examiner

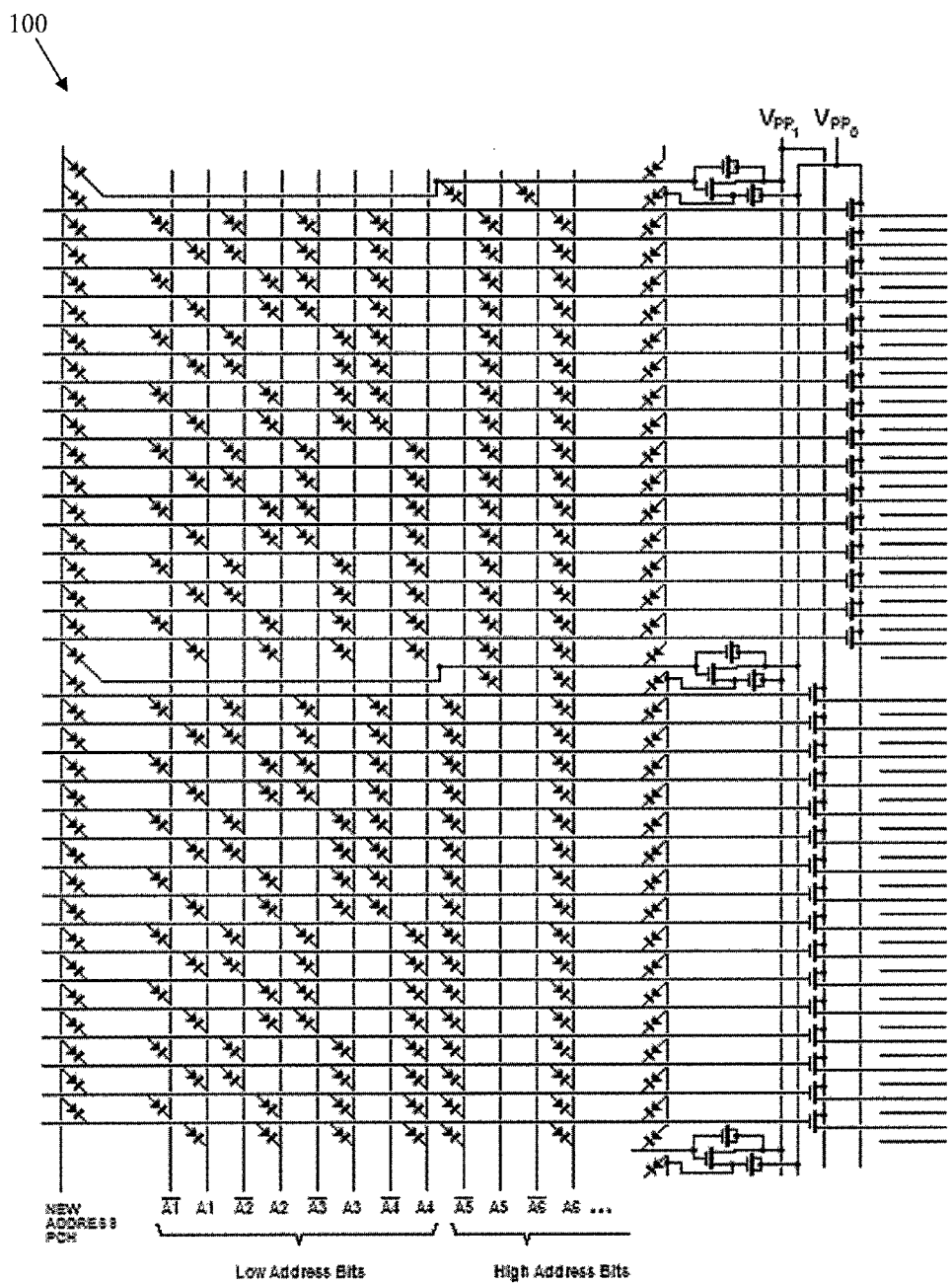

SEQUENCING DECODER CIRCUIT

CROSS-REFERENCE TO RELATED APPLICATION

This application claims priority to and the benefit of, and incorporates herein by reference in its entirety, U.S. Provisional Patent Application No. 61/195,449, which was filed on Oct. 7, 2008.

TECHNICAL FIELD

In various embodiments, the present invention relates to electronic circuits, and more particularly to electronic decoding circuits having low component complexity.

BACKGROUND

The semiconductor memory business is a very competitive one in which cost is a function of, among other things, the bit density, the die size, and the device yield. The price commanded by a memory part is further impacted by the part's access speed and power consumption (particularly in the case of memory parts that are to be used in portable devices). For the highest bit density, a memory array having a two feature square ($2F^2$) storage cell size is the most efficient (ignoring multiple bit per cell devices). A diode cross-point memory structure achieves this density. To interface to such a memory structure, row and column decoder circuits must be incorporated and, to minimize the die size, a high ratio of memory circuitry to peripheral circuitry must be achieved which requires that the decoder circuitry must be efficiently designed.

Array decoders based on diode decoding circuits are very efficient. Device yield must be maximized and, since redundant circuitry increases both die size and test (repair) costs, error correcting (ECC) techniques can be utilized in their place. Furthermore, to better support ECC efficiency in the case of defects in word lines and bit lines, a diagonal access technique (as is disclosed in U.S. Pat. No. 7,149,394 to Shepard, the entire disclosure of which is hereby incorporated by reference herein) can be employed which requires the word-line and bit-line access to advance while a data block is accessed. A trade-off is often an issue with speed and power consumption. Many memory decoders utilize a tree decoding structure to save power and reduce die size, but this can introduce decoding delays as the address decoding must be decoded in a first stage and be allowed to stabilize before decoding in a second or subsequent stage. This approach saves power by not energizing portions of the decoder outside of the tree branch being selected.

Many types of non-volatile storage arrays exist in the prior art and the array lines in most of these arrays are connected with decoder driver circuits. Often, as can be found in the prior art, to enable the drivers to be fabricated with half the pitch as the array lines themselves, these driver circuits are placed on both sides of the array with alternate array lines exiting the array on opposite sides. A drawback to this approach is that the decoder circuitry is duplicated to some degree on both sides of the array. If the decode circuitry is not very efficient, this duplication will significantly increase the die size and cost.

SUMMARY

Many types of electronic circuits exist in the prior art. With any given circuit, there can be many types of different components to implement a given functionality. Many of these circuits are ultimately implemented in a monolithic integrated circuit form. As it turns out, the cost of manufacturing an integrated circuit, or chip, is closely related to the number of process steps. For every different type of component included in a given chip, additional process steps are typically required. Therefore, in the design of a circuit, each addition of a component type adds to the final cost of manufacturing that chip.

Embodiments of the present invention feature a circuit block for implementing a particular functionality. This circuit block has been designed with low component complexity (i.e., with a goal of minimizing the number of different component types). Consequently, various embodiments implement a particular circuit functionality for low manufacturing cost. Furthermore, since many high density memory devices for use in consumer applications today work on block transfers of large data sets (e.g., a photograph image), most of the memory accesses consist of long, sequential operations; embodiments of the present invention may be used to sequentially advance through the memory space of a memory array.

Embodiments of the present invention may also achieve a diagonal access capability as well as power savings by auto-incrementing the address; only a small portion of the array that is sequentially adjacent to the most recently selected portion is precharged following each memory access. Various embodiments utilize a diode decoder with driver circuit that sequences the row selection automatically with each memory access. As will be clear to one skilled in the art, the same technique may be implemented for the array columns.

In an aspect, embodiments of the invention feature a memory-array decoder including or consisting essentially of first and second decoder stages. The decoder receives as input a plurality of address bits and is operably coupled to a memory array comprising a sequence of rows. The first decoder stage selects one or more first rows by decoding a first subset of the address bits. The second decoder stage selects one or more second rows based on locations, within the sequence, of one or more third rows different from the one or more second rows.

Embodiments of the invention may include one or more of the following. The one or more second rows may be selected by incrementing the locations of the one or more third rows. The one or more third rows may be selected by an applied signal different from the plurality of address bits alone or in conjunction with a second subset of the address bits. The first and second subsets of address bits may be different, and all of the address bits in the first subset may be different from those in the second subset. The second stage may be capable of selecting one or more second rows from all of the rows of the memory array. The plurality of address bits may include or consist essentially of an input memory address and its complement. The first stage may select a single first row from the one or more second rows selected by the second stage.

The memory array may be programmed with data including or consisting essentially of music, video, computer software, a computer application, reference data, text, and/or a diagram. The decoder and the memory array may be disposed within a removable memory storage device. The memory array may include or consist essentially of a plurality of storage cells. At least one of the storage cells may include or consist essentially of a phase-change material.

In another aspect, embodiments of the invention feature a method of forming a memory-array decoder that receives as input a plurality of address bits and is operably coupled to a memory array comprising rows and columns. The method includes or consists essentially of providing first and second decoder stages. The first decoder stage selects one or more first rows by decoding a first subset of the address bits. The second decoder stage selects one or more second rows based on locations, within the sequence, of one or more third rows different from the one or more second rows.

In yet another aspect, embodiments of the invention feature a method of decoding a memory array comprising rows and columns. A plurality of address bits is received as input by a decoder. A first stage of the decoder selects one or more first rows by decoding a first subset of the address bits. A second stage of the decoder selects one or more second rows based on locations, within the sequence, of one or more third rows different from the one or more second rows.

Embodiments of the invention may include one or more of the following. The one or more second rows may be selected by incrementing the locations of the one or more third rows. A signal different from the plurality of address bits may be applied to the decoder to select the one or more third rows. To select the one or more third rows, a signal different from the plurality of address bits may be applied to the decoder alone or in conjunction with the decoding of a second subset of the address bits. The first and second subsets of address bits may be different, and all of the address bits in the first subset may be different from those in the second subset. The second stage may be capable of selecting one or more second rows from all of the rows of the memory array. The plurality of address bits may include or consist essentially of an input memory address and its complement. Selecting the one or more first rows may include or consist essentially of selecting, with the first stage, a single row from the one or more second rows selected by the second stage.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawing, in which:

FIG. 1 is a circuit diagram of a sequencing decoder circuit with split, dual-sided decoding in accordance with various embodiments of the invention.

DETAILED DESCRIPTION

Embodiments of the present invention feature a sequencing diode decoder circuit for memory or other types of array circuits. This decoder, in a single decoding stage, performs the function of a multi-stage decoder by activating only a portion of the decode circuit at a time (following initial activation). In various embodiments, the decoder also automatically steps the access into the array thereby eliminating the need for a separate sequencing circuit or logic.

FIG. 1 depicts a sequencing diode decoder circuit 100 with split, dual sided decoding. A cross-point diode array with diode decoding is described in U.S. Pat. No. 5,673,218 to Shepard, the entire disclosure of which is hereby incorporated by reference herein. In the depicted array, power for reading or writing (+V) is applied to the array through the VPP inputs. One way to address a memory cell has +V applied to a given VPP input and a path to GND applied to a given column within the array (not shown in FIGURE). To select the desired row through the array, the gate of one of the row driver FETs must have a positive voltage applied to switch on that FET to pass the voltage from VPP.

In FIG. 1, the cross-point memory array structure is shown schematically with the word-line decoder being split and the halves positioned on opposite sides of the array. In such a structure, the word lines alternate between connecting to the left-side decoder and the right-side decoder (see U.S. Pat. No. 7,054,219 by Petti et al., the entire disclosure of which is hereby incorporated by reference). Specifically, lowest-order address line A0 selects between the two array access sides (e.g., a low state selects the left-side decoder and a high state selects the right-side decoder) and address lines A1 through A4 select one of sixteen word-lines in a group in the array. Referring to FIG. 1, at the right side of the FIGURE are the row lines into the array; only 64 lines of the array are shown and these are separated into two groups of 32—a top 32 and a bottom 32. Of the top 32 lines, half of the lines (the even numbered lines) are connected to the drive transistors shown as a column along the right side of the FIGURE (the odd numbered lines are connected to drive transistors in a decoder circuit on the right side of the array that is nearly identical to the decoder shown in FIG. 1). Of the bottom 32 lines, half of the lines (the even numbered lines) are connected to the drive transistors also shown as a column along the right side of the FIGURE (the odd numbered lines are also connected to drive transistors in the decoder circuit on the right side of the array). The top group is one of the even numbered groups and the bottom group is one of the odd numbered groups. There are many such even and odd groups in the array; an 8K×8K array would have 256 of these row groups. Located on the right of the FIGURE between the groups of row line drive transistors are three transistors in a cluster (there are three such trios shown, one at the top, middle and bottom of the FIGURE). Each of these trios performs a pass-forward of a token that enables the currently selected group to enable the group below it to be the next selected group.

Operation is initialized with a positive voltage pulse on the "NEW ADDRESS PCH" precharging input (PCH). This voltage is great enough to place a voltage on all the drive transistor gates (after passing through the that row's corresponding precharge diode) to allow a voltage from a $V_{PP}$ input to be passed to the desired row line. If the threshold voltage ($V_{TH}$) of the NMOS FETs is approximately 0.5 volts and the voltage drop on a diode ($V_f$) is approximately 0.7 volts and the desired active voltage ($V_R$) on the targeted row is approximately 2.5 volts, then the drive transistor gate voltage ($V_{GD}$) should be $V_R+V_{TH}$ (approximately 3.0 volts) as it should exceed the voltage for the row by the threshold voltage (to compensate for the drive transistor); the PCH input level should exceed the drive transistor gate voltage by the diode forward voltage (to compensate for the precharge diode voltage drop) $V_{GD}+V_f=V_R+V_{TH}+V_f$ or approximately 3.7 volts (the "PCH voltage"). Following this initial PCH pulse, all of the drive transistor gates will generally hold a voltage charge and the diode decoder is activated by pulling down on one of each of the complementary address pair inputs (as described in U.S. Pat. No. 5,673,218). The pull-down voltage should be low enough to shut off any given drive transistor by discharging its gate through the decoder diodes to below the turn on voltage; a pull down voltage level of approximately −0.7 volts will discharge the gates to approximately zero volts while taking the $V_f$ of the decoder diodes into account. After applying an address voltage pulse, only one transistor gate will remain switched on at which point a $V_{PP}$ signal may be raised to energize the desired row line. If each row group consists of N lines (e.g., 32 in FIG. 1) of which N/2 are connected to drive transistors on a given side of the array (e.g., 16 in FIG. 1), then the number of address bits in the "Low Address Bits" must be that number which can decode one out of N/2 in a binary decoding (e.g., 4 address bits in FIG. 1—A1 through A4). The lowest address bit (A0) is used to select the array side, left or right (the left side is shown in FIG. 1). The "High Address Bits" decode to select a given group of rows into the array (additional address bits will typically be utilized to decode the columns and may be decoded with a similar sequencing decoder circuit). The lowest-order bit of the "High Address Bits" (A5 in FIG. 1) generally identifies which of the $V_{PP}$ signals corresponds to which row group (when A5 is low, the bottom group shown in FIG. 1 is active and $V_{PP1}$ is utilized; when A5 is high, the top group shown in FIG. 1 is active and $V_{PP0}$ is utilized).

In an embodiment, within each of the trios of transistors, one transistor is configured as a switch transistor and two are configured as capacitors. When PCH is pulsed, the gate of the switch transistor of each trio is charged along with the drive transistor gates and when the address is asserted, only the switch transistor corresponding to the target group (shown in FIG. 1 as the trio just below the group) remains turned on; this is affected by the "High Address Bits" as the gates of the switch transistors are connected into the diode address decoder by only the "High Address Bits" and bypass the low address bits. In this way, when an address is decoded leaving one drive transistor turned on into the array, only the switch transistor of the trio associated with that group (the trio shown in FIG. 1 to be just below that group) will also be left turned on. In this way, when the $V_{PP}$ corresponding to the target group is raised, voltage from that $V_{PP}$ may pass through the selected drive transistor into the array as well as from that $V_{PP}$ through the switch transistor of the associated trio and through a string of (N/2)+1 diodes (or other non-linear elements) to precharge the gates of the transistors of the subsequent group (since this subsequent group is connected to the alternate $V_{PP}$ input, charging the gates of these drive transistors does not energize the associated rows into the array). It should also be noted that to precharge those gates sufficiently, $V_{PP}$ should be large enough to offset the voltage threshold of the switch transistor of the trio and the one diode of the string of (N/2)+1 diodes. As stated above, if the desired active voltage ($V_R$) on the targeted row is approximately 2.5 volts and the threshold voltage ($V_{TH}$) of the drive transistor is approximately 0.5 volts, the voltage on the gate of the drive transistor should be approximately 3.0 volts ($V_R+V_{TH}$). To place $V_R+V_{TH}$ on the gate of the drive transistors (given a forward voltage drop on a diode, $V_f$, is approximately 0.7 volts), then the voltage on the gate of the switch transistor in the trio should be ($V_R+V_{TH}$)+$V_f$+$V_{TH}$ or approximately 3.0+0.7+0.5 volts (approximately 4.2 volts). This may be achieved by adjusting the previously calculated voltage for PCH upward to approximately 4.9 volts by adding one additional voltage drop of $V_f$ to accommodate for the precharge diode. Alternatively, as is shown in FIG. 1, a capacitor may be added by incorporating an additional FET configured as a capacitor (the upper capacitor FET of each trio), as is well known and understood by those skilled in the art. This "boosting" capacitor will generally be sized to enable sufficient charge to be coupled to the gate of the switch transistor when $V_{PP}$ is applied so as to raise its voltage above the voltage placed thereon by the PCH input (taking into account the capacitance of the gate and of the diode decoder diodes also connected to that gate). If the applied PCH signal was approximately 3.7 volts, this boost should add an additional approximately 1.2 volts to the gate voltage. The amount of boost is typically a function of the level of $V_{PP}$, the size of the upper transistor of the trio and the parasitic capacitances and resistances associated with the gate of the switch transistor.

When $V_{PP}$ is passed through the switch transistor of the active trio and the one diode of the string of (N/2)+1 diodes to place the drive transistor gate voltage, $V_{GD}=V_R+V_{TH}$, on the gate of the drive transistors, this voltage is also placed on the gate of the switch transistor of the trio subsequent to the active trio (just as it is done during the application of PCH). In this way, following the initial application of PCH to the entire decoder circuit's drive transistor gates, the application of $V_{PP}$ will have the effect of performing the PCH application to only the next group (along with its corresponding transistor trio)—the drive transistors and the switch transistor of the trio will receive $V_{GD}$. Selection of a single line within that subsequent group is then affected by asserting the address inputs which will discharge all but one of the drive transistor gates for selection of a single row. Since the groups' drive transistors will alternately connect to one of the two $V_{PP}$ inputs, raising the alternate $V_{PP}$ following the selection of a single drive transistor within the group will energize the next row in sequence and will also have the effect of performing the PCH application to yet the next group with row energization occurring when returning to the initial $V_{PP}$ input, and so on. In effect, the selection of a row in each group sets up the subsequent group for selection. With the last group wrapping around and being connected to the first group, this process may continue over and over. Furthermore, at any point in the process a new address may be loaded to enable selection of a different numbered row within a group or the same address may be maintained for selection of the same row within multiple group selections. In addition, accesses may be affected from the decoder on one side of the array and then suspended in lieu of accesses via the other side of the array. As a variation, the accesses may be interleaved with accesses by the row decoder on the opposite side of the array, whereby during the address assertion phase on one side of the array, $V_{PP}$ could be applied via the other side.

In an embodiment, a third (optional) transistor, configured as a capacitor, is included in the trio of transistors as shown in FIG. 1. This is the lower capacitor transistor. This transistor may be utilized to help reduce the applied $V_{PP}$ voltage by boosting the voltage on the subsequent gates as required as a consequence of the lowered $V_{PP}$ voltage. Care should be taken to not assert the addresses while applying $V_{PP}$ in any way that would allow a current path from that $V_{PP}$ through a switch transistor in a trio through a diode of the string of (N/2)+1 diodes and then through the decoder diodes as excess power will be consumed and wasted.

Another embodiment of the present invention, while less compact to manufacture, has the sequential selection occurring at the finest decode resolution; that is, a single row in the array is selected and in so doing the pass-forward of the token goes to the next single row selection. This variation would use a subset of the address bits to select a starting point and then would walk through the rows sequentially.

Embodiments of the present invention will typically, though not necessarily, be built as integrated circuits. Variations will be apparent to those skilled in the art, including driver devices consisting of different types of components than NMOS FETs, as well as different numbers of components in more complex driver circuits. Embodiments may be implemented on the bit lines or on the word lines and bit-lines simultaneously. Embodiments may be implemented with cross-point memory arrays and these arrays may be one of many tiles or sub-arrays in a larger device or an array within a three-dimensional arrangement of arrays or tiles. The storage cells may include various non-linear elements, e.g., transistors, field-emitters, diodes, or any other device that conducts current better in one direction than the other for a given applied voltage. The storage element may be a fuse, an anti-fuse, a phase-change material such as a chalcogenide (including a chalcogenide in which the programmed resistivity may be one of two resistance values and, in the case of more than one bit per cell storage cells, in which the programmed resistivity may be one of three or more resistance values), or a field-emitter element programming mechanism including an element for which the resistance or the volume is changeable and programmable. Orientation of the array may be rotated, i.e., the "rows" may be "columns," or vice versa. The polarity of the voltages and direction of the steering elements in the storage bits may be reversed while still keeping within what is envisioned by embodiments of the present invention.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chip-sets or other custom or standard circuitry.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A memory-array decoder receiving as input a plurality of address bits and operably coupled to a memory array comprising a sequence of rows, the decoder comprising:
   a first decoder stage for pre-charging a first group of one or more rows by decoding a first subset of the address bits; and
   a second decoder stage for selecting one or more second rows based on locations, within the sequence, of one or more third rows different from the one or more second rows,
   wherein the second decoder stage selects a selected row within the first group by decoding a second subset of the address bits, the selection of the selected row pre-charging a second group of one or more rows different from the first group.

2. The decoder of claim 1, wherein the first subset of the address bits and the second subset of the address bits are different.

3. The decoder of claim 2, wherein no address bits in the first subset are within the second subset.

4. The decoder of claim 1, wherein the second stage is capable of selecting the selected row from all rows in the memory array.

5. The decoder of claim 1, wherein the plurality of address bits comprises an input memory address and its complement.

6. The decoder of claim 1, wherein the memory array is programmed with data comprising at least one of music, video, computer software, a computer application, reference data, text, or a diagram.

7. The decoder of claim 1, wherein the decoder and memory array are disposed within a removable memory storage device.

8. The decoder of claim 1, wherein the memory array comprises a plurality of storage cells, at least one of which comprises a phase-change material.

9. A method of forming a memory-array decoder receiving as input a plurality of address bits and operably coupled to a memory array comprising a sequence of rows, the method comprising:
   providing a first decoder stage for pre-charging a first group of one or more rows by decoding a first subset of the address bits; and
   providing a second decoder stage for selecting one or more second rows based on locations, within the sequence, of one or more third rows different from the one or more second rows,
   wherein the second decoder stage selects a selected row within the first group by decoding a second subset of the address bits, the selection of the selected row pre-charging a second group of one or more rows different from the first group.

10. A method of decoding a memory array comprising a sequence of rows, the method comprising:
    receiving as input, by a decoder, a plurality of address bits;
    pre-charging, with a first stage of the decoder, a first group of one or more rows by decoding a first subset of the address bits; and
    selecting, with a second stage of the decoder, one or more second rows based on locations, within the sequence, of one or more third rows different from the one or more second rows,
    wherein the second stage of the decoder selects a selected row within the first group by decoding a second subset of the address bits, the selection of the selected row pre-charging a second group of one or more rows different from the first group.

11. The method of claim 10, wherein the first subset of the address bits and the second subset of the address bits are different.

12. The method of claim 11, wherein no address bits in the first subset are within the second subset.

13. The method of claim 10, wherein the second stage is capable of selecting the selected row from all rows in the memory array.

14. The method of claim 10, wherein the plurality of address bits comprises an input memory address and its complement.

* * * * *